(12) United States Patent
Wang et al.

(10) Patent No.: US 9,685,463 B2
(45) Date of Patent: Jun. 20, 2017

(54) ARRAY SUBSTRATE, ITS MANUFACTURING METHOD, DISPLAY PANEL AND DISPLAY DEVICE

(71) Applicant: BOE TECHNOLOGY GROUP CO., LTD., Beijing (CN)

(72) Inventors: Jianguo Wang, Beijing (CN); Seongyeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 6 days.

(21) Appl. No.: 15/138,971

(22) Filed: Apr. 26, 2016

(65) Prior Publication Data

US 2016/0322396 A1    Nov. 3, 2016

(30) Foreign Application Priority Data

Apr. 30, 2015    (CN) .......................... 2015 1 0216868

(51) Int. Cl.
*H01L 29/04* (2006.01)
*H01L 27/12* (2006.01)
*H01L 29/786* (2006.01)
*H01L 29/66* (2006.01)
*G02F 1/1362* (2006.01)

(52) U.S. Cl.
CPC ........ *H01L 27/1225* (2013.01); *G02F 1/1362* (2013.01); *H01L 27/124* (2013.01); *H01L 27/1288* (2013.01); *H01L 29/66969* (2013.01); *H01L 29/7869* (2013.01); *H01L 29/78606* (2013.01); *G02F 1/136227* (2013.01); *G02F 1/136286* (2013.01); *G02F 2001/136295* (2013.01); *G02F 2201/501* (2013.01); *G02F 2202/103* (2013.01)

(58) Field of Classification Search
CPC .. H01L 27/32; H01L 27/3241; H01L 27/3244
See application file for complete search history.

(56) References Cited

U.S. PATENT DOCUMENTS

| 2011/0068340 A1* | 3/2011 | Lee | ..................... H01L 27/124 257/59 |
| 2014/0339539 A1* | 11/2014 | Yamazaki | ........... H01L 29/4908 257/43 |

* cited by examiner

*Primary Examiner* — Elias M Ullah
(74) *Attorney, Agent, or Firm* — Harness, Dickey & Pierce, P.L.C.

(57) ABSTRACT

The present disclosure provides an array substrate, its manufacturing method, a display panel and a display device. A conductive metal pattern of the array substrate is covered with an oxygen barrier film.

20 Claims, 3 Drawing Sheets

ARRAY SUBSTRATE, ITS MANUFACTURING METHOD, DISPLAY PANEL AND DISPLAY DEVICE

CROSS-REFERENCE TO RELATED APPLICATION

The present application clams a priority of the Chinese Patent Application No. 201510216868.X filed on Apr. 30, 2015, which is incorporated herein by reference in its entirety.

TECHNICAL FIELD

The present disclosure relates to the field of display technology, in particular to an array substrate, its manufacturing method, a display panel, and a display device.

BACKGROUND

Along with the development of the thin film transistor (TFT) industry and the improvement of the TFT manufacture process, liquid crystal display panels have attracted more and more attention due to their excellent display characteristics, and have been widely used in flat-panel display products, such as mobile phones, digital cameras, flat-panel computers, laptop computers and liquid crystal televisions.

Along with the development of the liquid crystal display technology, a liquid crystal display device having a large size, a high resolution and low production cost has attracted more and more attention. However, the larger the size of the liquid crystal display device, the more serious its impedance effect. In order to overcome this drawback, a material with a low resistance, such as Cu, is introduced so as to reduce a wire resistance. The application of this material is extremely restricted due to its features such as being easily oxidized, low yield and being easily diffused.

SUMMARY

An object of the present disclosure is to provide an array substrate, its manufacturing method, a display panel and a display device, so as to prevent a conductive metal on the array substrate from being oxidized, thereby to improve the performance and yield of the array substrate.

In one aspect, the present disclosure provides in some embodiments an array substrate, including a conductive metal pattern which is covered with an oxygen barrier film.

Alternatively, the conductive metal pattern includes a source electrode, a drain electrode and a data line.

Alternatively, the oxygen barrier film covers an upper surface and an oblique side surface of the conductive metal pattern.

Alternatively, the conductive metal pattern is made of Cu, or an alloy of Cu and at least one of Al, Mo and W.

Alternatively, the oxygen barrier film is a-Si film.

Alternatively, the a-Si film has a thickness of 100 to 180 nm.

Alternatively, the array substrate further includes a passivation layer arranged on the conductive metal pattern covered with the oxygen barrier film.

Alternatively, the array substrate further includes a via-hole penetrating through the passivation layer and the oxygen barrier film.

Alternatively, the array substrate further includes a pixel electrode which is connected to the drain electrode of the conductive metal pattern through the via-hole penetrating through the passivation layer and the oxygen barrier film.

In another aspect, the present disclosure provides in some embodiments a display panel including the above-mentioned array substrate.

In yet another aspect, the present disclosure provides in some embodiments a display device including the above-mentioned display panel.

In still yet another aspect, the present disclosure provides in some embodiments a method for manufacturing the above-mentioned array substrate, including steps of forming a conductive metal pattern, and then forming an oxygen barrier film covering the conductive metal pattern.

Alternatively, the method further includes providing a base substrate, depositing a gate metal layer on the base substrate, applying a photoresist onto the gate metal layer, exposing, developing and etching the photoresist with a mask plate so as to form a gate electrode, a gate line and a common electrode line which is connected to a common electrode, depositing a gate insulation layer, an active layer, an etch stop layer and a source/drain metal layer, applying a photoresist onto the source/drain metal layer, and exposing, developing and etching the photoresist with a mask plate so as to form a source electrode, a drain electrode and a data line, the source electrode and the drain electrode being connected to the active layer through a first via-hole in the etch stop layer. The step of forming the oxygen barrier film covering the conductive metal pattern includes depositing an a-Si film, applying a photoresist onto the a-Si film, and exposing, developing and etching the photoresist with a mask plate to form a pattern of the a-Si film which covers an upper surface and an oblique side surface of each of the data line, the source electrode and the drain electrode. The method further includes depositing a passivation layer, forming a second via-hole penetrating through the passivation layer and the a-Si film, depositing a transparent conductive layer, applying a photoresist onto the transparent conductive layer, and exposing, developing and etching the photoresist with a mask plate to form a pixel electrode which is connected to the drain electrode through the second via-hole penetrating through the passivation layer and the a-Si film.

According to the embodiments of the present disclosure, the conductive metal pattern of the array substrate is covered with the oxygen barrier film, so as to prevent the conductive metal pattern from being oxidized by an oxidizing gas such as $O_2$ or $N_2O$ during the manufacture of the array substrate. As a result, it is able to prevent the conductivity of the conductive metal pattern from being adversely affected, prevent the diffusion of the conductive metal, and improve the performance and the yield of the array substrate.

DETAILED DESCRIPTION OF THE EMBODIMENTS

Figure 1:
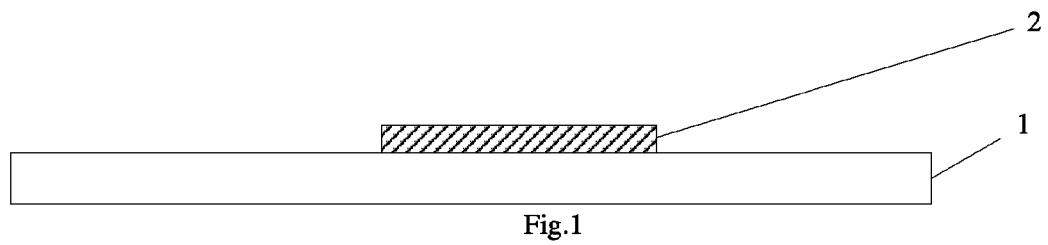
FIG. 1 is a sectional view of an array substrate where a common electrode is formed on a base substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the related art, Cu may easily be oxidized and diffused, so the performance of an array substrate may be adversely affected. An object of the present disclosure is to provide an array substrate, its manufacturing method, a display panel and a display device, so as to prevent a conductive metal on the array substrate from being oxidized, thereby to improve the performance and yield of the array substrate.

The present disclosure provides in some embodiments an array substrate, which includes a conductive metal pattern which is covered with an oxygen barrier film. In this way, it is able for the oxygen barrier film to prevent the conductive metal pattern from being oxidized by an oxidizing gas such as $O_2$ or $N_2O$ during the manufacture of the array substrate. As a result, it is able to prevent the conductivity of the conductive metal pattern from being adversely affected, prevent the diffusion of the conductive metal, and improve the performance and the yield of the array substrate.

Alternatively, the conductive metal pattern is a source electrode, a drain electrode and a data line.

Alternatively, the oxygen barrier film covers an upper surface or an oblique side surface of the conductive metal pattern, so as to completely cover the conductive metal pattern.

Alternatively, the conductive metal pattern is made of Cu, or an alloy of Cu and at least one of Al, Mo and W. Through the Cu-based low-resistance metal, it is able to effectively reduce a resistance of the conductive metal pattern, thereby to improve the conductivity of the conductive metal pattern.

Alternatively, the oxygen barrier film is a-Si film, and the a-Si film has a thickness of 100 to 180 nm. In this way, it is able to effectively protect the conductive metal pattern, and prevent a segment difference of the array substrate and the other layers from being adversely affected.

Alternatively, the array substrate may further include a passivation layer arranged on the conductive metal pattern covered with the oxygen barrier film. The passivation layer needs to be formed in an environment which is rich in an oxidizing gas such as $O_2$ or $N_2O$. Through the oxygen barrier film, it is able to prevent the conductive metal pattern from being oxidized by the oxidizing gas, thereby to ensure the conductivity of the conductive metal pattern.

The present disclosure further provides in some embodiments a display panel which includes the above-mentioned array substrate.

The present disclosure further provides in some embodiments a display device which includes the above-mentioned display panel. The display device may be any product or member having a display function, such as a liquid crystal panel, a liquid crystal television, a liquid crystal display, a digital photo frame, a mobile phone or a flat-panel computer.

The present disclosure further provides in some embodiments a method for manufacturing the above-mentioned array substrate, which includes steps of forming the conductive metal pattern, and then forming the oxygen barrier film covering the conductive metal pattern.

The array substrate in the embodiments of the present disclosure may be an array substrate of a horizontal electric field or a vertical electric field. The manufacturing method of the array substrate will be described hereinafter by taking an array substrate with an Advanced Super Dimension Switch (ADS) mode as an example.

The manufacturing method in the embodiments of the present disclosure may include the following steps.

Step 1: as shown in FIG. 1, a base substrate 1 may be provided. The base substrate may be a glass or quartz substrate. To be specific, a transparent conductive layer having a thickness of 30 to 50 nm may be deposited onto the washed base substrate 1 by magnetron sputtering, thermal evaporation or any other film-forming method. The transparent conductive layer may be made of indium tin oxide (no), indium zinc oxide (IZO) or aluminium zinc oxide (AZO). A photoresist may be applied onto the transparent conductive layer, and then exposed using a mask plate, so as to form a photoresist reserved region corresponding to a pattern of a common electrode 2 and a photoresist unreserved region corresponding to a region other than the pattern of the common electrode 2. Next, the photoresist may be developed, so as to fully remove the photoresist at the photoresist unreserved region and maintain a thickness of the photoresist at the photoresist reserved region. Then, the transparent conductive layer at the photoresist unreserved region may be fully etched off, and the remaining photoresist may be removed, so as to form the common electrode 2.

Figure 2:
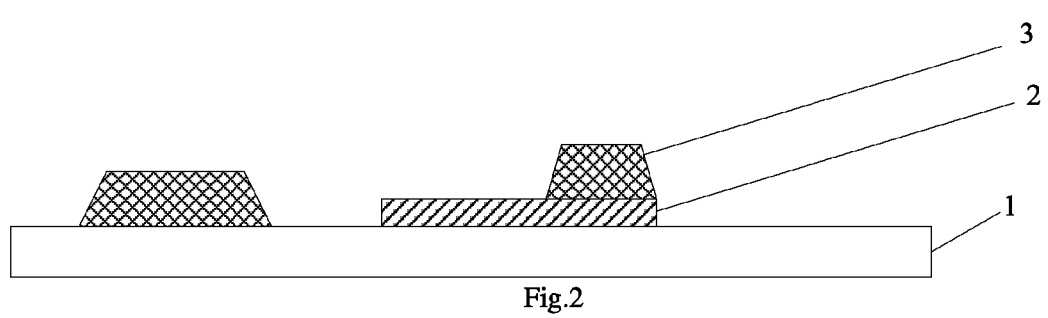
FIG. 2 is another sectional view of the array substrate where a gate electrode, a gate line and a common electrode line are formed according to one embodiment of the present disclosure.

Step 2: as shown in FIG. 2, a gate metal layer 3 having a thickness of 200 to 400 nm may be deposited onto the base substrate 1 obtained after Step 1 by sputtering or thermal evaporation. The gate metal layer 3 may be made of a Cu-based low-resistance metal, such as Cu, Cu/Mo, Cu/Ti, Cu/Mo/W, Cu/Mo/Nb or Cu/Mo/Ti, and it may be of a single-layered or multi-layered structure. A photoresist may be applied onto the gate metal layer 3 and then exposed with a mask plate, so as to form a photoresist reserved region corresponding to a region where a gate electrode, a gate line and a common electrode line are located, and a photoresist unreserved region corresponding to the other region. Next, the photoresist may be developed, so as to fully remove the photoresist at the photoresist unreserved region and maintain a thickness of the photoresist at the photoresist reserved region. Then, a gate metal film at the photoresist unreserved region may be fully etched off, and the remaining photoresist may be removed, so as to form the gate electrode, the gate line and the common electrode line which is connected to the common electrode 2.

Figure 3:
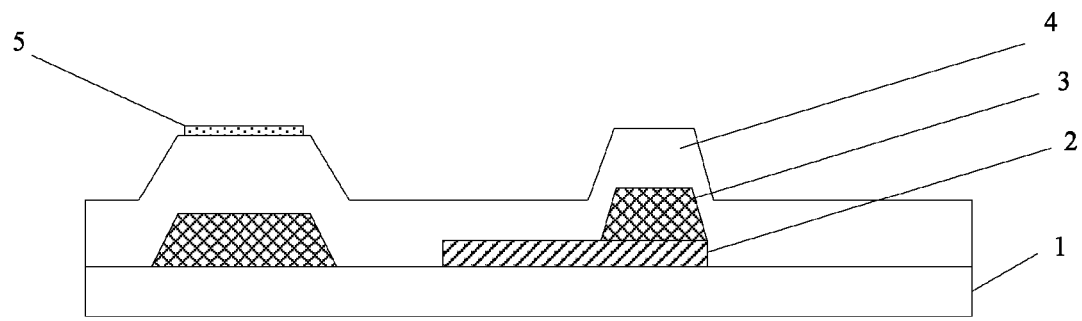
FIG. 3 is yet another sectional view of the array substrate where a gate insulation layer and an active layer are formed according to one embodiment of the present disclosure.

Step 3: as shown in FIG. 3, a gate insulation layer 4 having a thickness of 200 to 400 nm may be deposited on the base substrate 1 obtained after Step 2 by plasma enhanced chemical vapor deposition (PECVD). The gate insulation layer may be made of an oxide, a nitride or an oxynitride, and it may be of a single-layered, double-layered or multi-layered structure. To be specific, the gate insulation layer may be made of SiNx, SiOx or Si(ON)x. Then, an active layer having a thickness of 30 to 50 nm may be deposited by magnetron sputtering, thermal evaporation or any other film-forming method. The active layer may be made of indium gallium zinc oxide (IGZO), zinc oxide (ZnO), indium oxide (InO), indium tin zinc oxide (ITZO) or indium aluminium zinc oxide (IAZO). A photoresist may be applied onto the active layer 5 and then exposed with a mask plate, so as to form a photoresist reserved region corresponding to a region where a pattern of the active layer 5 is located, and a photoresist unreserved region corresponding to the other region. Next, the photoresist may be developed, so as to fully remove the photoresist at the photoresist unreserved region and maintain a thickness of the photoresist at the photoresist reserved region. Then, the active layer 5 at the photoresist unreserved region may be fully etched off, and the remaining photoresist may be removed, so as to form the pattern of the active layer 5.

Figure 4:
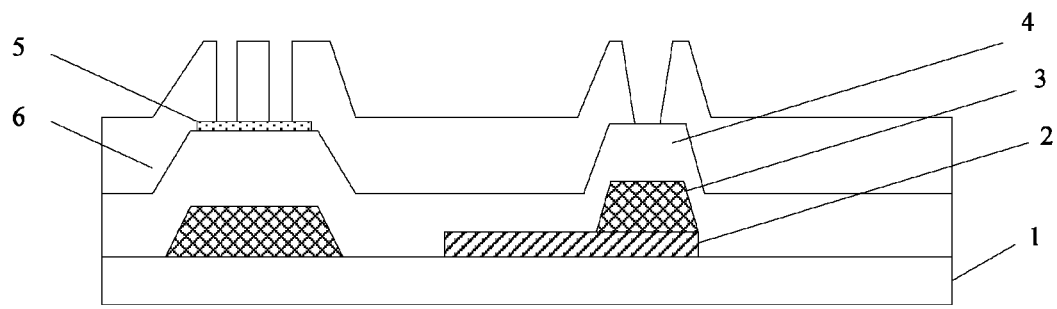
FIG. 4 is still yet another sectional view of the array substrate where an etch stop layer is formed according to one embodiment of the present disclosure.

Step 4: as shown in FIG. 4, an etch stop layer 6 having a thickness of 100 to 200 nm may be deposited onto the base substrate 1 obtained after Step 3 by magnetron sputtering, thermal evaporation, PECVD or any other film-forming method. The etch stop layer may be made of an oxide, a nitride or an oxynitride. It may be of a single-layered structure, or a double-layered structure consisting of a SiNx layer and a SiOx layer. To be specific, the etch stop layer may be made of SiO. A photoresist may be applied onto the etch stop layer 6 and then exposed with a mask plate, so as to form a photoresist reserved region corresponding a region where a first via-hole in the etch stop layer 6 is located, and a photoresist unreserved region corresponding to the other region. Next, the photoresist may be developed, so as to fully remove the photoresist at the photoresist unreserved region and maintain a thickness of the photoresist at the photoresist reserved region. Then, the etch stop layer 6 at the photoresist unreserved region may be fully etched off, and the remaining photoresist may be removed, so as to form a pattern of the etch stop layer 6 provided with the first via-hole.

Figure 5:
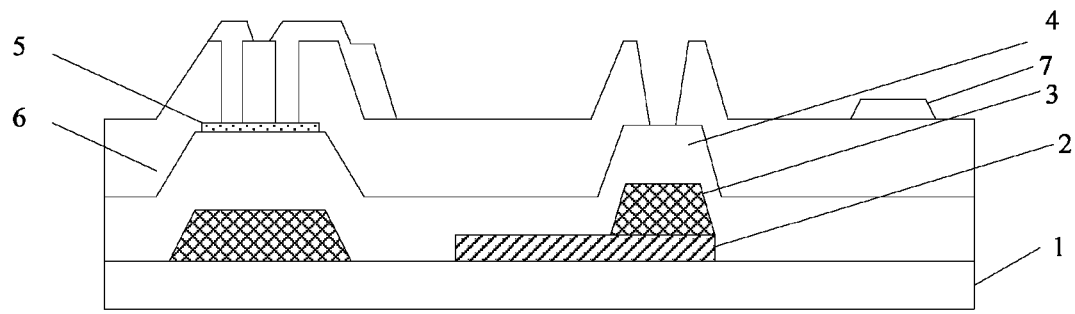
FIG. 5 is still yet another sectional view of the array substrate where a source electrode, a drain electrode and a data line are formed according to one embodiment of the present disclosure.

Step 5: as shown in FIG. 5, a source/drain metal layer 7 having a thickness of 200 to 300 nm may be deposited onto the base substrate 1 obtained after Step 4 by magnetron sputtering, thermal evaporation or any other film-forming method. The source/drain metal layer 7 may be made of a Cu-based low-resistance metal, such as Cu, Cu/Mo, Cu/Ti, Cu/Mo/W, Cu/Mo/Nb or Cu/Mo/Ti, and it may be of a single-layered or multi-layered structure. A photoresist may be applied onto the source/drain metal layer 7 and then exposed with a mask plate, so as to form a photoresist reserved region corresponding a region where the source electrode, the drain electrode and the data line are located, and a photoresist unreserved region corresponding to the other region. Next, the photoresist may be developed, so as to fully remove the photoresist at the photoresist unreserved region and maintain a thickness of the photoresist at the photoresist reserved region. Then, a source/drain metal film at the photoresist unreserved region may be fully etched off, and the remaining photoresist may be removed, so as to form the source electrode, the drain electrode and the data line. The source electrode and the drain electrode are connected to the active layer 5 through the first via-hole in the etch stop layer 6.

Figure 6:
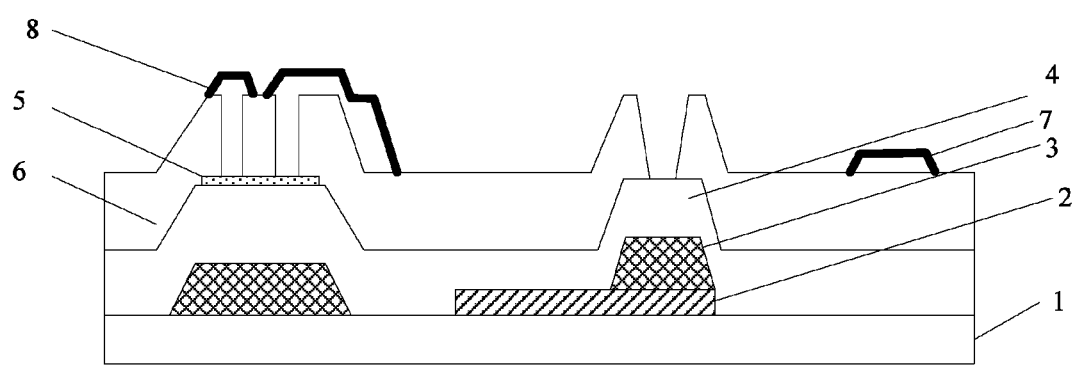
FIG. 6 is still yet another sectional view of the array substrate where an a-Si film is formed according to one embodiment of the present disclosure.

Step 6: as shown in FIG. 6, an a-Si film 8, e.g., a non-hydrogenated a-Si film having a thickness of 100 to 180 nm, may be deposited onto the base substrate 1 obtained after Step 5. A photoresist may be applied onto the a-Si film 8 and then exposed with a mask plate, so as to form a photoresist reserved region corresponding to a region where the a-Si film 8 is located, and a photoresist unreserved region corresponding to the other region. Next, the photoresist may be developed, so as to fully removed the photoresist at the photoresist unreserved region and maintain a thickness of the photoresist at the photoresist reserved region. Then, the a-Si film 8 at the photoresist unreserved region may be fully etched off, and the remaining photoresist may be removed, so as to form a pattern of the a-Si film 8. The pattern of the a-Si film 8 may fully cover the data line, the source electrode and the drain electrode, i.e., cover an upper surface and an oblique side surface of each of the data line, the source electrode and the drain electrode.

Figure 7:
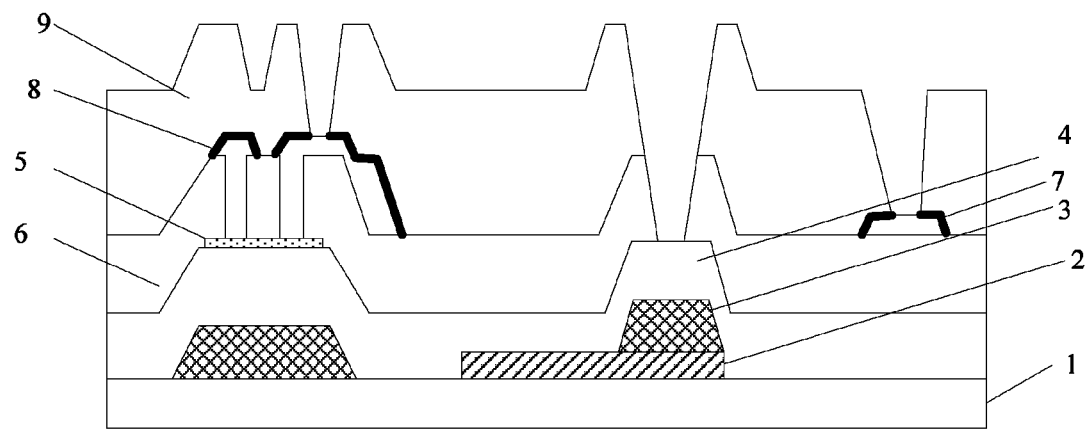
FIG. 7 is still yet another sectional view of the array substrate where a passivation layer is formed according to one embodiment of the present disclosure.

Step 7: as shown in FIG. 7, a passivation layer 9 may be deposited onto the base substrate 1 obtained after Step 6 by magnetron sputtering, thermal evaporation, PECVD or any other film-forming method. The passivation layer may be made of an oxide, a nitride or an oxynitride, and it may be of a single-layered structure, or a double-layered structure consisting of a SiNx layer and a SiOx layer, e.g., a SiO layer and a SiON layer. A photoresist may be applied onto the passivation layer 9 and then exposed with a mask plate, so as to form a photoresist unreserved region corresponding to a region where a second via-hole in the passivation layer 9 is located, and a photoresist reserved region corresponding to the other region. Next, the photoresist may be developed, so as to fully removed the photoresist at the photoresist unreserved region and maintain a thickness of the photoresist at the photoresist reserved region. Then, the passivation layer 9 and the a-Si film 8 therebelow at the photoresist unreserved region may be fully etched off, and the remaining photoresist may be removed, so as to form a pattern of the passivation layer 9, with the second via-hole penetrating through the passivation layer 9 and the a-Si film 8.

Figure 8:
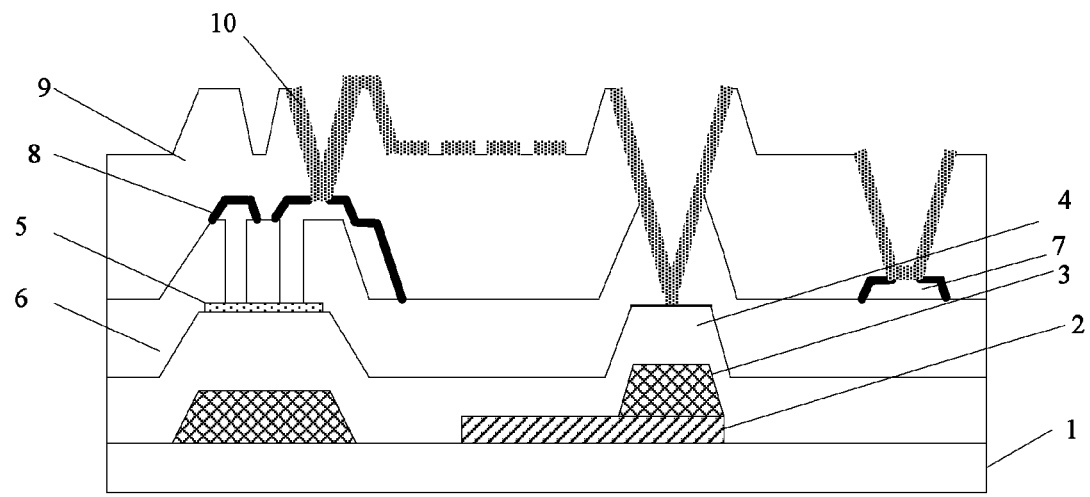
FIG. 8 is still yet another sectional view of the array substrate where a pixel electrode is formed according to one embodiment of the present disclosure.

Step 8: as shown in FIG. 8, a transparent conductive layer having a thickness of 30 to 50 nm may be deposited onto the base substrate 1 obtained after Step 7 by magnetron sputtering, thermal evaporation or any other film-forming method. The transparent conductive layer may be made of ITO, IZO or AZO. A photoresist may be applied onto the transparent conductive layer and then exposed with a mask plate, so as to form a photoresist reserved region corresponding to a region where a pattern of a pixel electrode 10 is located, and a photoresist unreserved region corresponding to the other region. Next, the photoresist may be developed, so as to fully remove the photoresist at the photoresist unreserved region and maintain a thickness of the photoresist at the photoresist reserved region. Then, the transparent conductive layer at the photoresist unreserved region may be fully etched off, and the remaining photoresist may be removed, so as to form the pixel electrode 10. The pixel electrode 10 is connected to the drain electrode through the second via-hole penetrating through the passivation layer 9 and the a-Si film 8.

The array substrate as shown in FIG. 8 may be obtained through the above-mentioned steps. The source electrode, the drain electrode and the data line of the array substrate in the embodiments of the present disclosure may be made of a Cu-based low-resistance metal, so as to improve their conductivity. The source electrode, the drain electrode and the data line are covered with the a-Si film, so as to prevent their upper surfaces and the side surfaces from being oxidized by an oxidizing gas such as $O_2$ or $N_2O$ during the manufacture of the array substrate, thereby to ensure their conductivity. In addition, it is able to prevent the diffusion of the Cu-base metal, thereby to improve the performance and the yield of the array substrate. Further, in the case of forming the second via-hole in the passivation layer, the a-Si film at a position corresponding to the second via-hole may also be etched off, so the connection between the pixel electrode and the drain electrode may not be adversely affected.

Although the above description is given by taking the ADS-mode array substrate with an etch stop layer (ESL) structure as an example, the present disclosure is not limited thereto, and it may also be applied to a low temperature poly-Si (LTPS) TFT array substrate, or an oxide TFT array substrate with a back channel etch (BCE) structure.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An array substrate, comprising a conductive metal pattern, wherein the conductive metal pattern is covered and in direct contact with an oxygen barrier film for preventing the conductive metal pattern from being oxidized, and the entire oxygen barrier film is in direct contact with the conductive metal pattern.

2. The array substrate according to claim 1, wherein the conductive metal pattern comprises a source electrode, a drain electrode and a data line.

3. The array substrate according to claim 1, wherein the oxygen barrier film covers an upper surface and an oblique side surface of the conductive metal pattern.

4. The array substrate according to claim 1, wherein the conductive metal pattern is made of Cu, or an alloy of Cu and at least one of Al, Mo and W.

5. The array substrate according to claim 1, wherein the oxygen barrier film is a-Si film.

6. The array substrate according to claim 5, wherein the a-Si film has a thickness of 100 to 180 nm.

7. The array substrate according to claim 1, further comprising a passivation layer arranged on the conductive metal pattern covered with the oxygen barrier film.

8. The array substrate according to claim 7, further comprising a via-hole penetrating through the passivation layer and the oxygen barrier film.

9. The array substrate according to claim 8, further comprising a pixel electrode which is connected to the drain electrode of the conductive metal pattern through the via-hole penetrating through the passivation layer and the oxygen barrier film.

10. A display panel, comprising the array substrate according to claim 1.

11. The display panel according to claim 10, wherein the conductive metal pattern comprises a source electrode, a drain electrode and a data line.

12. The display panel according to claim 10, wherein the oxygen barrier film covers an upper surface and an oblique side surface of the conductive metal pattern.

13. The display panel according to claim 10, wherein the conductive metal pattern is made of Cu, or an alloy of Cu and at least one of Al, Mo and W.

14. The display panel according to claim 10, wherein the oxygen barrier film is a-Si film.

15. The display panel according to claim 14, wherein the a-Si film has a thickness of 100 to 180 nm.

16. The display panel according to claim 10, wherein the array substrate further comprises a passivation layer arranged on the conductive metal pattern covered with the oxygen barrier film.

17. The display panel according to claim 16, wherein the array substrate further comprises a via-hole penetrating through the passivation layer and the oxygen barrier film, and the array substrate further comprises a pixel electrode which is connected to the drain electrode of the conductive metal pattern through the via-hole penetrating through the passivation layer and the oxygen barrier film.

18. A display device, comprising the display panel according to claim 10.

19. A method for manufacturing the array substrate according to claim 1, comprising steps of:
    forming the conductive metal pattern; and
    forming the oxygen barrier film such that the oxygen barrier film covers the conductive metal pattern, and the entire oxygen barrier film is in direct contact with the conductive metal pattern to prevent the conductive metal pattern from being oxidized.

20. The method according to claim 19, further comprising steps of:
    providing a base substrate;
    depositing a gate metal layer on the base substrate;
    applying a photoresist onto the gate metal layer;
    exposing, developing and etching the photoresist with a mask plate so as to form a gate electrode, a gate line and a common electrode line which is connected to a common electrode;
    depositing a gate insulation layer, an active layer, an etch stop layer and a source/drain metal layer;
    applying a photoresist onto the source/drain metal layer; and
    exposing, developing and etching the photoresist with a mask plate so as to form a source electrode, a drain electrode and a data line, the source electrode and the drain electrode being connected to the active layer through a first via-hole in the etch stop layer,
    wherein the step of forming the oxygen barrier film covering the conductive metal pattern comprises:
    depositing an a-Si film, applying a photoresist onto the a-Si film, and exposing, developing and etching the photoresist with a mask plate to form a pattern of the a-Si film which covers an upper surface and an oblique side surface of each of the data line, the source electrode and the drain electrode, and
    the method further comprises steps of:
    depositing a passivation layer;

forming a second via-hole penetrating through the passivation layer and the a-Si film;
depositing a transparent conductive layer;
applying a photoresist onto the transparent conductive layer; and
exposing, developing and etching the photoresist with a mask plate to form a pixel electrode which is connected to the drain electrode through the second via-hole penetrating through the passivation layer and the a-Si film.

* * * * *